United States Patent
Davis

(10) Patent No.: US 7,054,372 B2
(45) Date of Patent: May 30, 2006

(54) DIGITAL TRANSMISSION LINE TAP CIRCUIT

(75) Inventor: Kevin C. Davis, Flanders, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 736 days.

(21) Appl. No.: 09/737,370

(22) Filed: Dec. 15, 2000

(65) Prior Publication Data

US 2002/0075962 A1    Jun. 20, 2002

(51) Int. Cl.
*H04B 14/06* (2006.01)

(52) U.S. Cl. ............... 375/251; 375/247; 375/257; 379/403; 379/413.04; 330/86

(58) Field of Classification Search ............ 375/251, 375/257, 247; 379/382, 394, 398, 402, 405, 379/403, 413.01, 413.04; 330/51, 107, 282, 330/86, 76, 100; 370/458; 725/119; 327/94–95
See application file for complete search history.

(56) References Cited

U.S. PATENT DOCUMENTS

| | | | | |
|---|---|---|---|---|
| 4,087,754 A | * | 5/1978 | Song | 375/247 |
| 4,868,516 A | * | 9/1989 | Henderson et al. | 330/86 |
| 5,333,192 A | * | 7/1994 | McGinn | 379/413.04 |
| 5,519,342 A | * | 5/1996 | McEwan | 327/94 |
| 5,881,148 A | * | 3/1999 | Koenig et al. | 379/413.01 |
| 6,205,218 B1 | * | 3/2001 | Fischer et al. | 379/403 |

OTHER PUBLICATIONS

Hewlett Packard 3787B Technical Manual, Publication Date: on or before Jan. 1, 1990, Place of Publication: Unknown.

* cited by examiner

*Primary Examiner*—Khai Tran
*Assistant Examiner*—Edith Chang

(57) ABSTRACT

A digital transmission line tap circuit is provided for applying a non-intrusive tap on a digital transmission line thus allowing the transmission signal to be monitored or utilized by another piece of transmission equipment. The tap circuit incorporates all the required functions of the tap in one circuit and eliminates large components, such as termination transformers.

19 Claims, 1 Drawing Sheet

DIGITAL TRANSMISSION LINE TAP CIRCUIT

BACKGROUND OF THE INVENTION

1. Field of the Invention

The present invention relates generally to the field of transmission lines. Specifically, the present invention relates to a tap circuit for coupling to a telecommunication transmission line that does not disrupt the operation or transmission of information through the line.

2. Description of the Related Art

Tap circuits for digital transmission lines have existed for quite some time, and include a series of circuits that must provide the high impedance tap, terminate the line with a proper impedance to prevent reflections back into the transmission line, and then provide a means of amplification and wave shaping before the signal can be used by further line interface circuitry to recover the digital clock and data.

Prior art tap circuits utilize extensive circuitry and components for performing the tap, termination, amplification and signal wave shaping functions. Due to the extensive circuitry of prior art tap circuits, and also the typical use of large electrical components, prior art tap circuits are impractical for use in extremely space limited applications.

SUMMARY OF THE INVENTION

The present invention provides a tap circuit that incorporates the tap, termination, amplification and signal wave shaping functions into a single circuit that replaces much of the circuitry and components that are normally required of prior art tap circuits. The tap circuit of the present invention can be built with smaller components as compared to prior art tap circuits, thus allowing for the use of the inventive tap circuit in extremely space limited applications.

The digital transmission line tap circuit of the present invention provides a means of applying a non-intrusive tap on a digital transmission line thus allowing the transmission signal to be monitored or utilized by another piece of transmission equipment. The tap circuit of the present invention incorporates all the required functions of the tap in one circuit and eliminates large components, such as termination transformers. The tap circuit of the present invention is designed to operate on balanced lines. Unbalanced cable arrangements require conversion of the incoming signal to a balanced arrangement.

The tap circuit of the present invention is most suitable for telecommunication transmission lines designed for T1- and E1-based telecommunication systems, i.e., telecommunication systems transmitting primary digital rates of 1.544 Mbit per second (T1) and 2.048 Mbit per second (E1).

BRIEF DESCRIPTION OF THE DRAWING

The invention is further explained by way of example and with reference to the accompanying drawing, wherein.

DETAILED DESCRIPTION OF THE PREFERRED EMBODIMENTS

Figure 1:
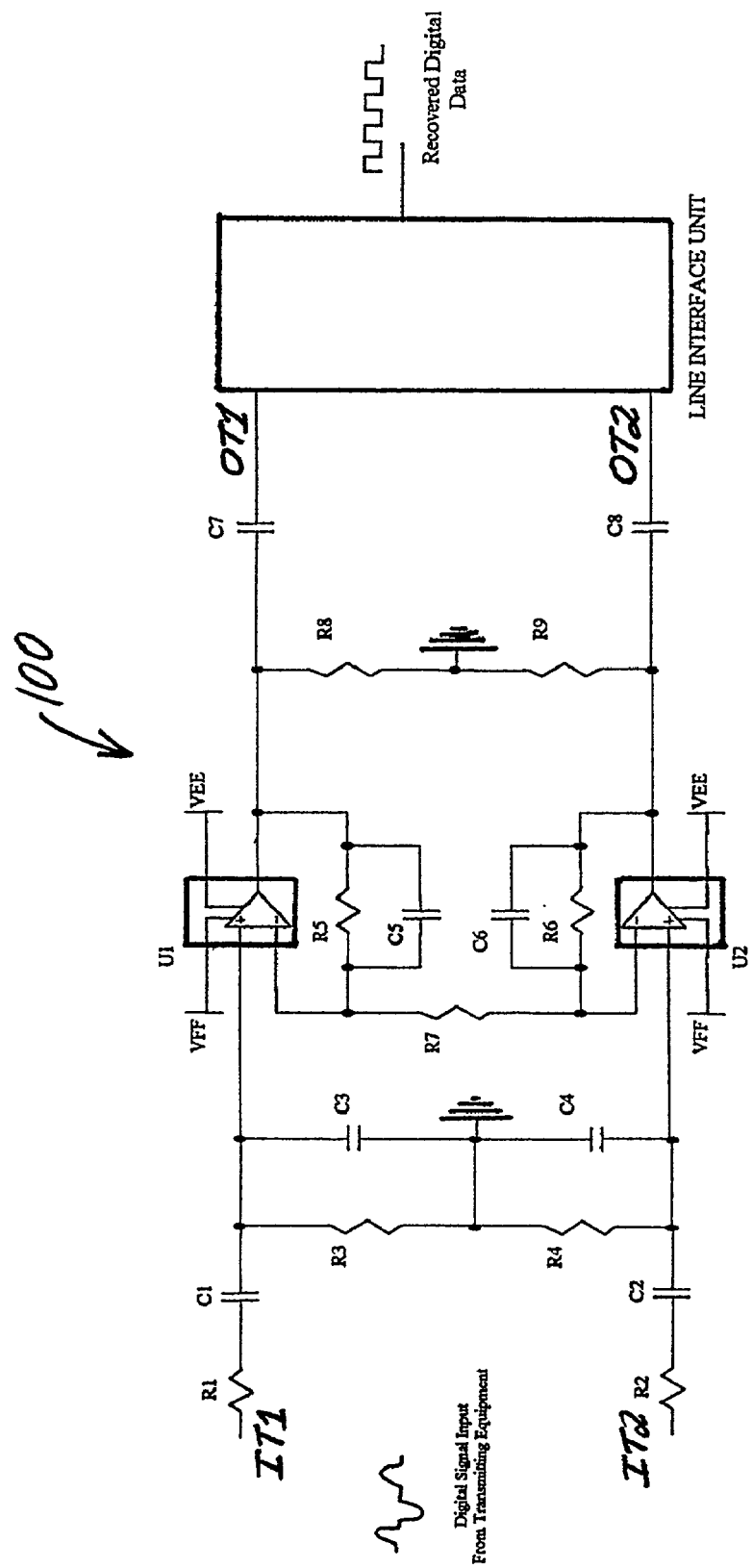
FIG. 1 illustrates a digital transmission line tap circuit according to the present invention.

The digital transmission line tap circuit of the present invention utilizes a single stage balanced amplification circuit arrangement to provide a high impedance tap, terminate a transmission line with a proper impedance to prevent reflections of a received signal back into the transmission line, and amplify and wave shape the received signal, while maintaining the received signal in a balanced scheme for utilization by widely available Line Interface Unit (LIU) circuits, such as integrated and other electrical circuits. The tap circuit is suitable for telecommunication transmission lines designed for T1- and E1-based telecommunication systems, i.e., telecommunication systems transmitting primary digital rates of 1.544 Mbit per second (T1) and 2.048 Mbit per second (E1).

The tap circuit of the present invention utilizes two fundamental principles related to the transmission line itself and the characteristics of the LIU circuits available in order to achieve the reduction in complexity and associated component count. First, the circuit design is based on the principle that the transmission line to be tapped will utilize a complete loop from one piece of transmission equipment to another. Due to this characteristic, the transmission line will be properly balanced and terminated between the equipment, thus providing a proper transmission path that results in the signal wave shape being correct at any given point on the line where the tap circuit may be employed.

In contrast, if only one end of the transmission line was connected, the line would not be properly terminated and the signal would be distorted due to the fact that the originating equipment transmits the digital signal with a gain and wave shape that is designed to compensate for the characteristic impedances and losses of a properly terminated line. Other tap circuit designs have attempted to provide full termination schemes that deal with these open line scenarios in order to match the line impedance to prevent reflections and to bring the signal wave shape back into its correct form. The tap circuit of the present invention allows the transmission line itself to provide these termination functions, since the line being tapped is already properly terminated at both equipment ends; thus the input stage of the tap circuit which receives the transmission line signal does not require circuitry to terminate the line and to extensively reshape the signal.

The second concept the tap circuit of the present invention utilizes deals with the characteristics of the input stage built into the LIU integrated circuits chips that are used to recover the digital data. These integrated circuits are packaged as single chip devices that are designed specifically for interfacing to a digital transmission line. Their main function is to provide a means for converting the received digital signal coming from the transmission line, which is in a bipolar balanced transmission scheme of a specific wave shape and intensity, into a binary digital signal that is common to digital logic circuitry. In this manner, the LIU provides the fundamental physical interface between the signaling requirements for the transmission line and the digital circuitry of the transmission equipment that is either sending or receiving the signal. Normally, an incoming signal to an LIU must pass through a series of circuitry to terminate and balance the transmission line before it can be presented to the input circuitry on the LIU itself. This type of arrangement is standard practice when utilizing an LIU to serve as a formal termination to transmission line.

However, in order to provide a high impedance tap to a given transmission line, resistors need to be placed in each leg of the tap in order to prevent the extra connection from loading down the line, and disrupting the impedance match and signal on the line itself. Doing this, however, reduces the signal arriving at the LIU inputs by over 20 dB, which typically results in a signal that is too low to be utilized effectively by the LIU to recover the signal. Most prior art tap circuit designs have simply added a means of amplifying this weakened signal back up to a level to represent a normal terminated incoming signal by placing an amplifier circuit somewhere in series with the typical LIU interface circuitry.

The tap circuit of the present invention addresses this problem in a unique manner. The circuitry must also cut down the incoming signal to prevent loading the transmission line, and must also provide amplification of that signal for use by the LIU. The tap circuit of the present invention takes advantage of the fact that the typical input circuitry on the LIU chip is essentially an arrangement of operational amplifier circuits that converts the incoming balance line signal into an unbalanced signal. The tap circuit of the present invention, therefore, recognizes that the operational amplifiers in the first stage of the LIU presents a very high impedance load, and thus, the tap circuit is designed to optimize the matching to that first stage. This is counter to prior art tap circuit designs that simply placed amplifiers in line with the existing components utilized for a full transmission line termination.

The tap circuit of the present invention, therefore, has been optimized to provide a high impedance load to the transmission line while providing an amplified output that directly interfaces with the LIU input circuitry itself. Thus, in a single stage design, the tap circuit eliminates many of the components used in prior art tap circuit designs while providing all of the functions required to properly tap the line and to present a viable signal to the LIU. Further, the tap circuit of the present invention can be built with very small, inexpensive components, and represents a significant savings in board space and cost.

The tap circuit of the present invention is illustrated by FIG. 1 and designated by reference numeral 100. Resistors R1, R2 connected to input terminals IT1, IT2 provide the high impedance load needed to tap the digital transmission line. Capacitors C1, C2 block any direct current levels that might be present in the incoming signal, and resistors R3, R4 provide a dissipation load for the incoming signal so that it can appear as varying voltage at the positive input terminals of the operational amplifiers. Capacitors C3, C4 suppress high frequency noise that might be present in the incoming signal and to shape the signal prior to amplification. Operational amplifiers U1, U2 provide the necessary amplification to boost the signal back up to a usable level for the LIU. The operational amplifiers U1, U2 are powered by voltages VEE and VFF which are preferably provided by a voltage power supply (not shown). Standard operational amplifiers are preferably used for operational amplifiers U1, U2 which have sufficient bandwidth to handle the incoming signal without distorting it.

The balanced pair arrangement of operational amplifiers U1, U2 is dictated by feedback resistors R5, R6, R7, and capacitors C5, C6 provide wave shaping of the output signal and prevent high frequency oscillation of the tap circuit 100. Since the output signal from the tap circuit 100 is fed into a high impedance input of an associated LIU, resistors R8, R9 provide a dissipation load to the output stage of operational amplifiers U1, U2 in order impress the signal into the LIU input stage and to prevent signal reflection. Finally, capacitors C7, C8 connected to output terminals OT1, OT2 provide blocking of any direct currents from the amplification circuit that could disrupt the operation of the LIU input circuitry. Operational amplifiers U1, U2 typically operate with −5 VDC and +5 VDC supply rails, but other voltages could be used depending on the application.

The gain of the tap circuit 100 can be adjusted by varying resistors R3, R4, resistors R5, R6, R7, or resistors R8, R9. However, there are limiting returns on the range that the gain can be varied for each resistor. Lowering the value of resistor R7 can greatly increase the gain, but may overdrive the LIU circuitry. Increasing the value of resistors R7 will lower the gain, but the changes will roll off to the point where the gain will be controlled by other aspects of the circuit due to the great reduction in the feedback between operational amplifiers U1, U2, as well as the lose of the balancing feedback between each signal leg. Increasing resistors R3, R4 can increase the gain by increasing the impressed voltage into operational amplifiers U1, U2, but can create less than ideal matching to the tapped digital transmission line, and may disrupt its operation. Changing resistors R8, R9 does not have much affect, due to the high impedance output of the tap circuit 100 and high impedance input of the LIU unless these values are greatly reduced. Modifying resistors R5, R6 can vary the gain as well; however, care must be taken that the values of these resistors are set such that amplifiers U1, U2 are not over-driven or thrown into oscillation. The value of resistor R7 may have to be modified as well in this case in order to return the circuit to an operational state. Preferably, the best way to modify the gain is to decrease resistor R7 to increase gain, and to lower resistors R3, R4 to decrease gain. By doing so, resistor R7 can directly affect the signal level reaching the LIU, and changing resistors R3, R4 can lower the gain below the roll off point where increasing resistor R7 becomes effective without disrupting the digital transmission line being tapped.

The tap circuit 100 has been coupled to a 120 ohm impedance twisted pair transmission line transmitting a DS1 signal at 1.544 Mbit, and has shown to provide proper amplification for a loop length from zero meters to well over 210 meters of common 26 gauge or 22 gauge transmission wire.

Varying the values of the components can optimize the tap circuit 100 for use with several different LIU chips, which could have slightly different front ends, and different line impedances as well. Accordingly, it is contemplated that other component values may be necessary for other applications to achieve the proper line matching, wave shaping and gain.

As previously discussed, the tap circuit 100 represents advancements over prior art tap circuit designs. For example, a prior art tap circuit design is the Hewlett Packard 3787B DS1 interface circuit utilized in a Hewlett Packard 3787B Digital Data Test Set. The 3787B DS1 interface circuit utilizes discrete circuitry to recover the digital data from the signal rather than an LIU, but its front end still consists of a terminating transformer and an amplifier to boost the signal. The 3787B DSI interface circuit essentially includes conventional line interface circuitry and adds an amplification stage in order to compensate for the reduced incoming digital signal that applying high impedance taps produce. This adds cost and complexity to the design as the resulting amplified signal must also be shaped and modified to match the existing interface circuitry as if it were a conventional, unattenuated digital signal arriving from the transmission line.

The tap circuit 100 of the present invention is a ground-up design that eliminates many components and bulky items, such as termination transformers, utilized in prior art tap circuit designs and provides an effective, simple design that integrates all the required tapping functions at a lower cost and a reduction in component count. It is contemplated that the tap circuit 100 can be fully constructed with extremely small surface mount devices as well, in order to make the tap circuit 100 highly applicable to situations where circuit board space is at a premium or a very high number of tap circuits is required.

The tap circuit 100 can be utilized whenever there is a need for a non-intrusive tap on a digital transmission line that utilizes a balanced line format, primarily DS1 or ISDN based lines. Further, the tap circuit 100 can be utilized wherever there is a need for a low cost or space limited implementation.

It is contemplated that the tap circuit 100 can be utilized by any entity, equipment provider, or individual that must provide a means of non-intrusive monitoring of digital transmission lines. It is further contemplated that the tap circuit 100 can be adapted to other potential balanced line digital transmission data rates, such as DS1C or Digital Data Services (DDS) subrates. For these applications, the circuit layout would remain the same, but the component values would need to be adjusted to provide the proper termination, amplifier gain and signal wave shaping for each instance.

Further still, it is contemplated that the tap circuit 100 can be utilized in providing tap capability to CEPT (E1) formatted transmission lines that are utilized in most international transmission equipment. The tap circuit 100 is limited to those lines that utilize a balanced transmission scheme, as some CEPT based equipment utilizes a 75 ohm unbalanced coaxial wiring scheme. However, BALUN blocks, as known in the art, can be used that can convert an unbalanced wiring scheme to a balanced transmission scheme for utilizing the tap circuit 100 of the present invention.

Although the illustrative embodiments of the present disclosure have been described herein with reference to the accompanying drawing, it is to be understood that the disclosure is not limited to that precise embodiment, and that various other changes and modifications may be affected therein by one skilled in the art. That is, those skilled in the art will envision other modifications within the scope and spirit of the claims appended hereto.

What is claimed is:

1. A transmission line tap circuit, comprising:
   at least two input terminals configured for coupling to a transmission line;
   impedance load circuitry configured to provide an impedance load to the transmission line for tapping the transmission line and receiving a transmission signal propagating there through, wherein the impedance load circuitry comprises circuitry configured to provide a dissipation load for the received transmission signal;
   amplifying circuitry configured to amplify the received transmission signal and directly connected to the impedance load circuitry, wherein the impedance load circuitry configured to provide the dissipation load provides at least two varying voltages to at least two input terminals of the amplifying circuitry;
   impedance matching circuitry configured to provide an impedance match to an impedance load of at least one Line Interface Unit (LIU) and directly connected to a plurality of outputs of the amplifying circuitry; and
   at least two output terminals configured for coupling said transmission signal to the at least one LIU and directly connected to the impedance matching circuitry.

2. The circuit according to claim 1, wherein the impedance load circuitry, the amplifying circuitry, and the impedance matching circuitry are provided within a single stage.

3. The circuit according to claim 1, wherein the impedance load circuitry includes at least two resistors where a first of the at least two resistors is connected to a first of the at least two input terminals and a second of the at least two resistors is connected to a second of the at least two input terminals.

4. The circuit according to claim 1, wherein the impedance load circuitry further comprises circuitry configured to block direct current present in the received transmission signal.

5. The circuit according to claim 4, wherein the circuitry configured to block direct current includes at least a first capacitor connected to a first of the at least two input terminals and a second capacitor connected to a second of the at least two input terminals.

6. The circuit according to claim 1, wherein the circuitry configured to provide a dissipation load for the received transmission signal includes at least two resistors connected in series to form a resistor chain, a first end of the resistor chain couoled to a first input terminal of the amplifying circuitry and a second end of the resistor chain coupled to a second input terminal of the amplifying circuitry.

7. The circuit according to claim 1, wherein the impedance load circuitry further comprises circuitry configured to suppress noise in the received transmission signal and to shape the received transmission signal.

8. The circuit according to claim 7, wherein the circuitry configured to suppress noise in the received transmission signal and to shape the received transmission signal includes at least two capacitors connected in series and coupled to the at least two input terminals.

9. The circuit according to claim 1, wherein the amplifying circuitry includes circuitry configured to wave shape the received transmission signal, at least two amplifiers each having respective feedback resistors, and at least two capacitors in parallel to a respective one of the feedback resistors.

10. The circuit according to claim 1, wherein the impedance load circuitry further comprises circuitry configured to provide a dissipation load to the amplifying circuitry.

11. The circuit according to claim 10, wherein the circuitry configured to provide a dissipation load is in parallel to the amplifying circuitry and includes at least two resistors connected in series to form a resister chain, one end of the resistor chain coupled to one of the at least two output terminals and another end of the resistor chain coupled to another of the at least two output terminals.

12. The circuit according to claim 1, wherein the impedance matching circuitry further comprises circuitry configured to block direct current from the amplifying circuitry.

13. The circuit according to claim 12, wherein the circuitry configured to block direct current includes at least two capacitors, a first capacitor of the at least two capacitors coupled to one of the plurality of outputs of the amplifying circuitry and one of the at least two output terminals, a second capacitor of the at least two capacitors coupled to another of the plurality of outputs of the amplifying circuitry and another of the at least two output terminals.

14. The circuit according to claim 1, wherein the transmission line is a T1 transmission line.

15. The circuit according to claim 1, wherein the transmission line is a E1 transmission line.

16. The circuit according to claim 1, wherein at least a portion of at least one of the impedance load circuitry, the amplifying circuitry, and the impedance matching circuitry is configured to adjust the gain of the circuit.

17. A method for interfacing a transmission line with at least one Line Interface Unit (LIU), the method comprising the steps of:

providing an impedance load to the transmission line for tapping the transmission line and receiving, via at least two input terminals, a transmission signal propagating there through;

providing a dissipation load for the received transmission signal;

amplifying the received transmission signal via amplifying circuitry directly connected to the impedance load, wherein the dissipation load provides at least two varying voltages to at least two input terminals of the amnlifying circuitry;

providing an impedance match to an impedance load of the at least one LIU via direct connection from a plurality of outputs of the amplifying circuitry; and providing, via at least two output terminals, the amplified signal to the at least one LIU.

18. The method according to claim 17, further comprising the steps of:

blocking direct current present in the received transmission signal; and suppressing noise in the received transmission signal.

19. A transmission line tap circuit, comprising:

means for providing an impedance load to a transmission line for tapping the transmission line and receiving, via at least two input means, a transmission signal propagating there through, wherein the means for providing an impedance load comprises a means for providing a dissipation load for the received transmission signal;

means for amplifying the received transmission signal, the means for amplifying being directly connected to the impedance load, wherein the means for providing the dissipation load provides at least two varying voltages to the means for amplifying the received transmission signal; and means for providing an impedance match to an impedance load of at least one Line Interface Unit (LIU) for providing, via at least two output means, the amplified signal to the at least one LIU, such that the means for providing the impedance match is directly connected to a plurality of outputs of the means for amplifying.

* * * * *